United States Patent [19]
Wang

[11] Patent Number: 6,121,091
[45] Date of Patent: Sep. 19, 2000

[54] REDUCTION OF A HOT CARRIER EFFECT PHENOMENA VIA USE OF TRANSIENT ENHANCED DIFFUSION PROCESSES

[75] Inventor: Jyh-Haur Wang, Hsin-chu, Taiwan

[73] Assignee: Taiwan Semiconductor Manufacturing Company, Hsin-Chu, Taiwan

[21] Appl. No.: 09/234,056

[22] Filed: Jan. 19, 1999

[51] Int. Cl.[7] .............................................. H01L 21/8234
[52] U.S. Cl. ........................................ 438/275; 438/305
[58] Field of Search .................................. 438/200, 275, 438/303, 305, 306, 307, 308

[56] References Cited

U.S. PATENT DOCUMENTS

| | | | |
|---|---|---|---|
| 5,559,050 | 9/1996 | Alsmeier et al. | 437/45 |
| 5,670,391 | 9/1997 | Lim et al. | 437/25 |
| 5,759,904 | 6/1998 | Dearnaley | 438/528 |
| 5,792,699 | 8/1998 | Tsui | 438/290 |
| 5,834,352 | 11/1998 | Choi | 438/275 |
| 6,008,077 | 12/1999 | Maeda | 438/275 |

OTHER PUBLICATIONS

Nayak et al., "A Comprehensive Study of Performance and Reliability of P, As, and Hybrid As/P nLDD Junctions for Deep–Submicron CMOS Logic Technology", IEEE Electron Device Letters, vol. 18, No. 6, Jun. 1997.

*Primary Examiner*—Chandra Chaudhari
*Attorney, Agent, or Firm*—George O. Saile; Stephen B. Ackerman

[57] ABSTRACT

A process for fabricating a core device, featuring an LDD source/drain region, with a sharp dopant profile, while simultaneously fabricating an I/O device, featuring an LDD source/drain region, with a graded dopant profile, has been developed. The process features the initial creation of the core device, LDD source/drain region, via an ion implantation, and RTA procedure, resulting in an LDD region with a sharp dopant profile, needed for enhanced performance. The I/O device, LDD source/drain region, is next addressed via an ion implantation procedure, followed by the creation of insulator spacers, formed at a temperature that TED occurs, to allow a graded dopant profile to be achieved for the I/O device, source/drain region, thus reducing hot carrier reliability risks.

21 Claims, 3 Drawing Sheets

REDUCTION OF A HOT CARRIER EFFECT PHENOMENA VIA USE OF TRANSIENT ENHANCED DIFFUSION PROCESSES

BACKGROUND OF THE INVENTION (1) Field of the Invention

The present invention relates to processes used to fabricate semiconductor devices, and more specifically to a semiconductor fabrication process which results in reliability improvements for specific devices, on a semiconductor chip, while maintaining the performance of other devices, fabricated on the same semiconductor chip.

(2) Description of the Prior Art

Most semiconductor chip designs request high voltage, input/output, (I/O), devices, along with core devices, which operate at lower voltages than the I/O device counterparts. To realize maximum performance, the core devices are created featuring short channel regions. The use of the performance enhancing short channel regions, for the core devices, require such features as heavier channel doping, anti-punchthrough implant regions, and shallow, abrupt source/drain regions, which would be adversely influenced by transient enhanced diffusion, (TED), which would disrupt, or alter, the intricate concentration profile of these features. Therefore a rapid thermal anneal, (RTA), procedure, is used to activate the ion implanted species, used to create features such as a lightly doped source/drain, (LDD), region, resulting in activation of the implanted species, however without diffusion, or movement of the implanted species, thus preserving the desired dopant concentration profile, and allowing the performance offered by these features, such as the LDD source/drain region, to be realized.

The I/O devices, however operating at a higher voltage than the core memory device counterparts, are more susceptible to a hot carrier effect, (HCE), when created using the sharper dopant profiles, used for the core devices. The I/O devices would benefit, in terms of a decreased HCE reliability phenomena, from graded dopant profiles, obtained via procedures presenting TED. This invention will describe a process in which I/O devices are fabricated, featuring graded, less abrupt dopant regions, enhancing reliability, while the core devices are simultaneously fabricated, with the sharper diffusion regions, needed for performance. This is accomplished via a process sequence which delays the creation of critical I/O dopant regions, to after the use of an RTA procedure, used to activate dopants in only the core device regions. After creation of the I/O LDD regions, subsequent thermal procedures, resulting in TED, will allow the desired grading of the I/O dopant regions to occur, while the RTA treated core device regions, will remain unmoved. Prior art, such as an article titled, "A Comprehensive Study of Performance and Reliability of P, As and Hybrid As/P n LDD Junctions for Deep-Submicron CMOS Logic Technology", by Nayak et al, in IEEE ELECTRON DEVICE LETTERS, Vol. 18, No. 6, June 1997, describes a method in which the LDD is fabricated using both arsenic and phosphorous, to enhance performance, and preserve reliability. That prior art however, does not show the process described in this invention, in which both I/O and core devices, are simultaneously created, each exhibiting the desired dopant profile, achieved via delaying the creation of the dopant regions of the I/O devices, to a point in the fabrication sequence, in which the core device, dopant regions, have already been fixed.

SUMMARY OF THE INVENTION

It is an object of this invention to simultaneously fabricate core devices, and I/O devices, on the same semiconductor chip.

It is another object of this invention to use fabrication sequences, such as source/drain ion implantation and RTA anneal procedures, that result in optimum core device, dopant profiles, needed for the desired performance.

It is still another object of this invention to ion implant the LDD source/drain region, for the I/O device, after formation of the core device LDD regions, than intentionally skip the post ion implant, RTA anneal, proceeding to the sidewall spacer, and heavily doped source/drain ion implantation procedures, to create an I/O device, LDD region, exhibiting the graded dopant profile, needed to reduce HCE reliability exposures.

In accordance with the present invention, a semiconductor fabrication sequence is described, in which core devices are fabricating featuring sharp LDD dopant profiles, needed for optimum performance, while I/O devices, featuring more graded LDD dopant profiles, needed for reliability purposes, accomplished via eliminating a post-ion implantation, RTA procedure, for the I/O device, LDD regions, are also created. After formation of gate structures, on a thin gate insulator layer, core device, LDD regions are formed in a first region of the semiconductor substrate, via a first ion implantation procedure, and a first RTA anneal procedure. A second ion implantation procedure is than performed in a second region of the semiconductor substrate, to be used for the I/O devices. Insulator spacers are next formed on the sides of all gate structures, resulting in transient enhanced diffusion, and a graded dopant profile, for the I/O device, LDD regions, while the LDD regions, of the core device, are not influenced by the thermal excursions of the insulator spacer deposition, as a result of experiencing the first RTA procedure. A third ion implantation procedure, and a second RTA procedure, are next used to create the heavily doped source/drain regions, for both the core, and I/O devices.

BRIEF DESCRIPTION OF THE DRAWINGS

The object and other advantages of this invention, are best described in the preferred embodiment with reference to the attached drawings that include.

DESCRIPTION OF THE PREFERRED EMBODIMENTS

The method of simultaneously creating core devices, with sharp LDD dopant profiles, needed to achieve optimum performance, and I/O devices, featuring a more graded LDD dopant profile, needed to reduce reliability exposures, will now be described in detail. This invention will be shown for N channel, (NFET), metal oxide semiconductor field effect transistors, (MOSFET), devices, however if desired this invention can be applied to P channel, (PFET), devices, as well.

Figure 1:
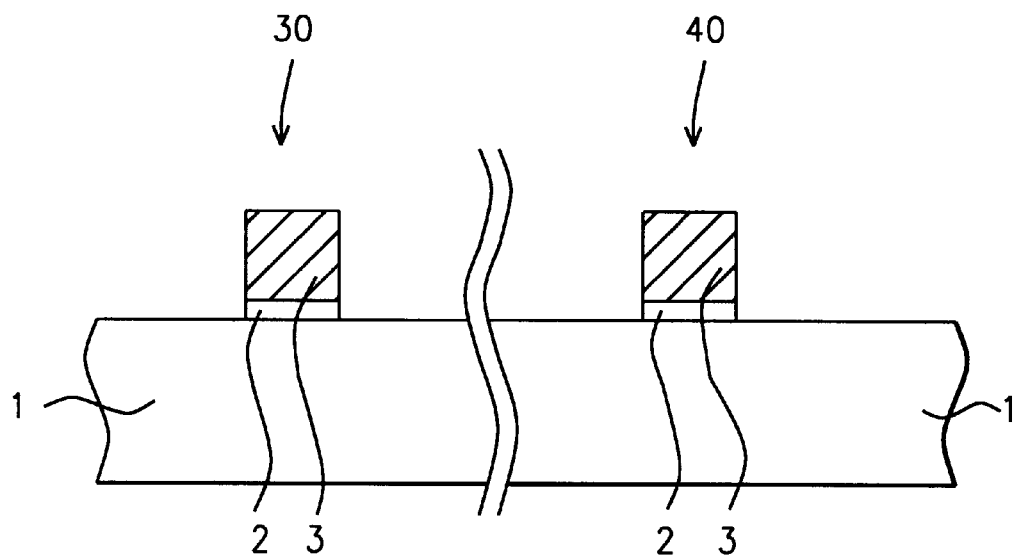
FIGS. 1–6, which schematically, in cross-sectional style, show the key stages of fabrication, used to create core devices, with sharp LDD dopant profiles, and I/O devices, with more graded LDD dopant profiles.

A P type semiconductor substrate 1, comprised of single crystalline silicon, with a <100> crystallographic orientation, is used and schematically shown in FIG. 1. Region 30, of semiconductor substrate 1, will be used for core device fabrication, while region 40, will be used for fabrication of the I/O devices. A silicon dioxide, gate insulator layer 2, is thermally grown, in an oxygen-steam ambient, at a temperature between about 700 to 1000° C., to a thickness between about 10 to 90 Angstroms. Gate structures 3, schematically shown in FIG. 1, in both core device region 30, and in I/O device region 40, are next created. Gate structures 3, can be comprised of a doped polysilicon layer, or of a polycide, (metal silicide-polysilicon), layer. The polysilicon gate structure option is achieved via low pressure chemical vapor deposition, (LPCVD), of a polysilicon layer, at a thickness between about 1000 to 3000 Angstroms. The polysilicon layer is either doped in situ, during deposition, via the addition of arsine, or phosphine, to a silane ambient, or the polysilicon layer is deposited intrinsically, than doped via ion implantation of arsenic or phosphorous ions. Conventional photolithographic, and reactive ion etching procedures, using $Cl_2$ as an etchant, are used to create polysilicon gate structure 3, schematically shown in FIG. 1. The polycide gate structure, used if lower word line resistance is desired, is created via initially depositing an in situ doped, polysilicon layer, via LPCVD procedures, at a thickness between about 1000 to 2000 Angstroms, followed by the deposition of a metal silicide layer, such as tungsten silicide, via LPCVD procedures, at a thickness between about 1000 to 2000 Angstroms. Again conventional photolithographic and RIE procedures, using $Cl_2$ as an etchant, are used to create the polycide gate structures. Removal of the photoresist shape, used as a mask for definition of the gate structures, is accomplished via plasma oxygen ashing and careful wet cleans. The wet cleans result in the removal of gate insulator 2, in regions in which gate insulator 2, is not covered by gate structures 3.

Figure 2:
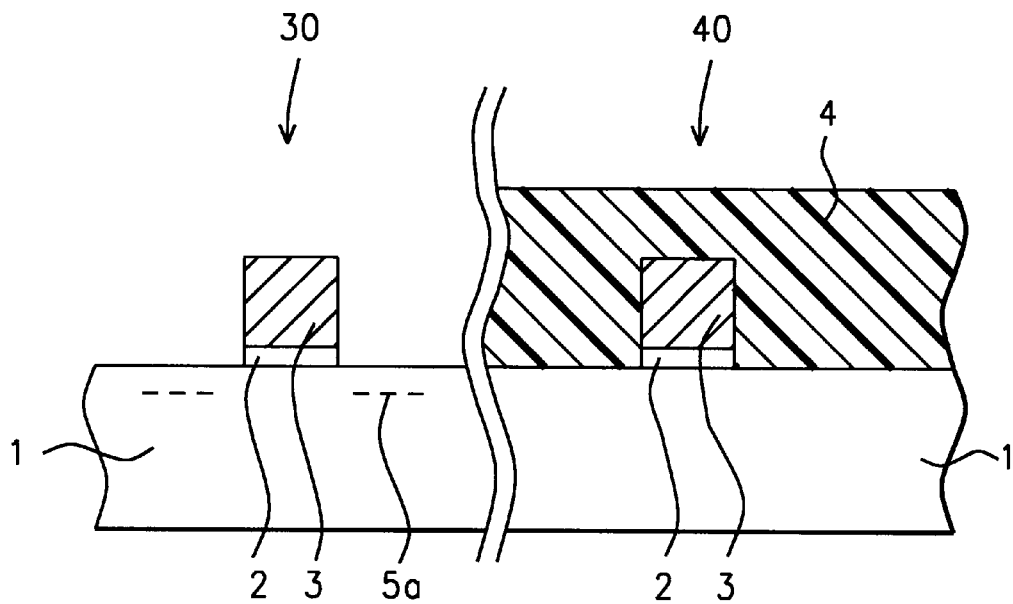
Figure 3:
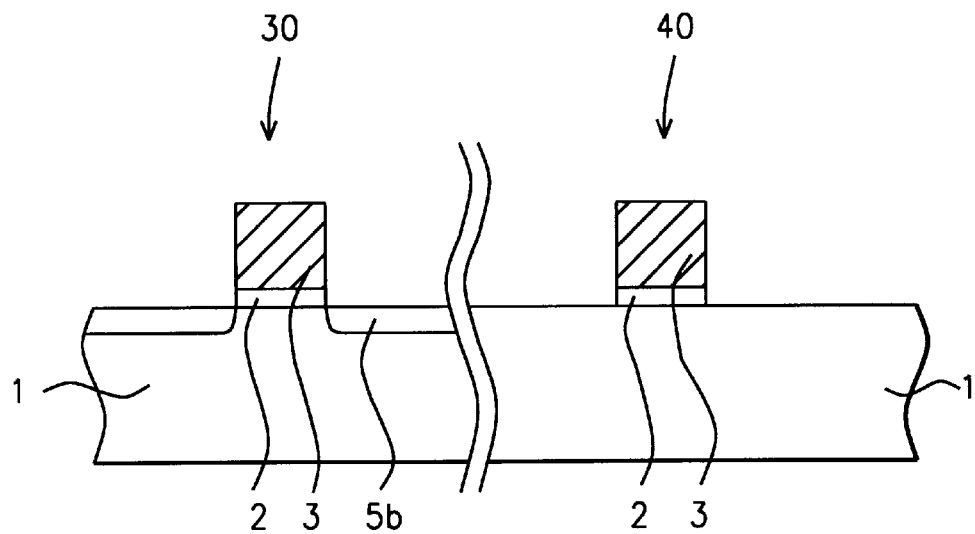

Photoresist shape 4, is used as a mask, to allow a first ion implantation procedure to be performed only in core device region 30. The first ion implantation procedure, performed using arsenic or phosphorous ions, at an energy between about 0.5 to 10 KeV, at a dose between about 1E14 to 1E15 atoms/cm$^2$, results in the creation of unactivated LDD region 5a, in core device region 30, shown schematically in FIG. 2. After removal of photoresist shape 4, via plasma oxygen ashing and careful wet cleans, a first RTA procedure is performed at a temperature between about 900 to 1050° C., for a time between about 1 to 30 sec, in a nitrogen ambient, creating core device, LDD region 5b, schematically shown in FIG. 3. Core device, LDD region 5b, exhibits a sharp dopant profile, needed for optimum device performance. The activating, first RTA procedure, sets, or fixes the dopant profile of core memory device, LDD region 5b, therefore subsequent thermal procedures, used for the I/O device LDD regions, will not change the dopant profile for the activated, core device, LDD region 5b.

Figure 4:
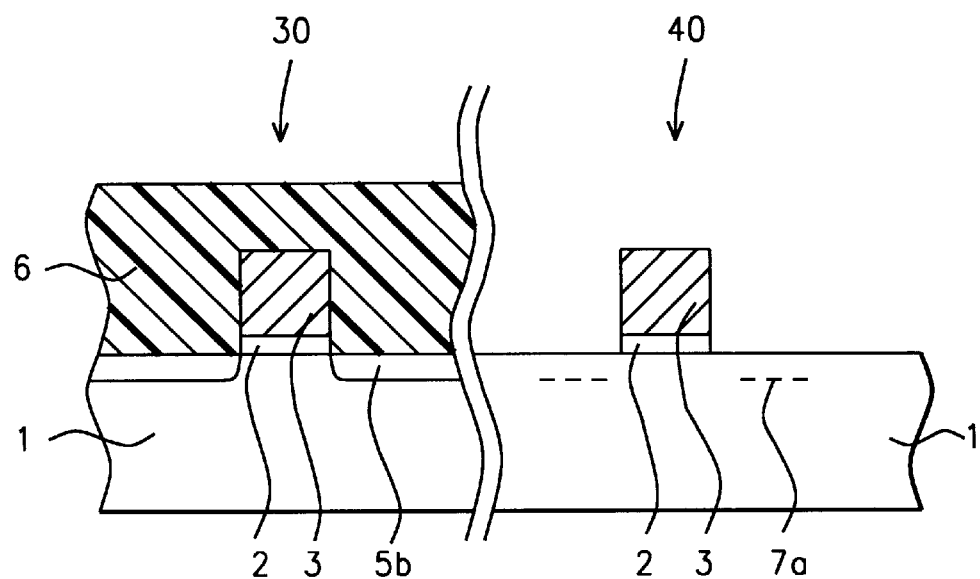

Photoresist shape 6, is next used as a block out mask, to allow a second ion implantation procedure, to create unactivated, LDD region 7a, in I/O device region 40, shown schematically in FIG. 4. The second ion implantation procedure is performed using arsenic or phosphorous ions, at an energy between about 5 to 50 KeV, at a dose between about 1E13 to 1E14 atoms/cm$^2$. Photoresist shape 6, is removed via plasma oxygen ashing and careful wet cleans.

Figure 5:
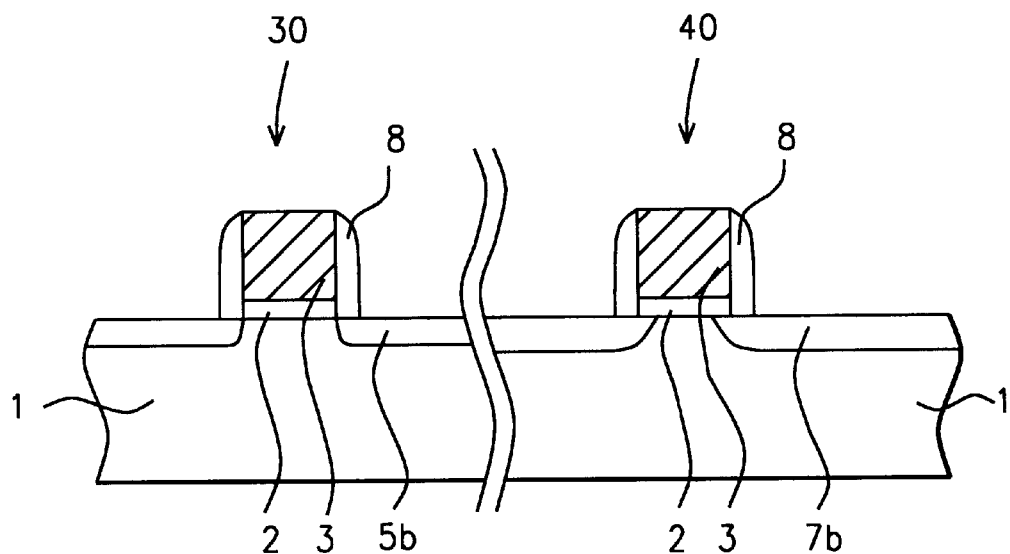

Unlike the sequence used for fabrication of core device, LDD region 5b, unactivated, LDD region 7a, is not subjected to an RTA anneal. The RTA procedure is eliminated so that a subsequent insulator spacer deposition, will provide the TED needed to create graded, LDD region 7b, schematically shown in FIG. 5. The graded dopant profile of LDD region 7b, is needed to reduce the risk of hot electron injection, for the I/O devices, which operate at a higher voltage than core device counterparts, and thus are more exposed to this reliability risk. A less graded, or sharper, dopant profile, such as the dopant profile of core device LDD region 5b, would increase the risk of hot electron injection. Thus the processing of insulator spacers 8, shown schematically in FIG. 5, provide the transient enhanced diffusion needed to grade, the unactivated, I/O device, LDD regions, while not influencing the activated, core device, LDD regions. Insulator spacers 8, comprised of silicon oxide or silicon nitride, are formed at a thickness between about 200 to 2000 Angstroms, via LPCVD procedures, at a temperature between about 650 to 850°, for a time between about 1 to 600 min. An anisotropic RIE procedure, using either $SF_6$, $CF_4$, $CHF_3$, or $C_2F_6$, as an etchant, results in the formation of insulator spacers 8, on the sides of gate structures 3.

Figure 6:
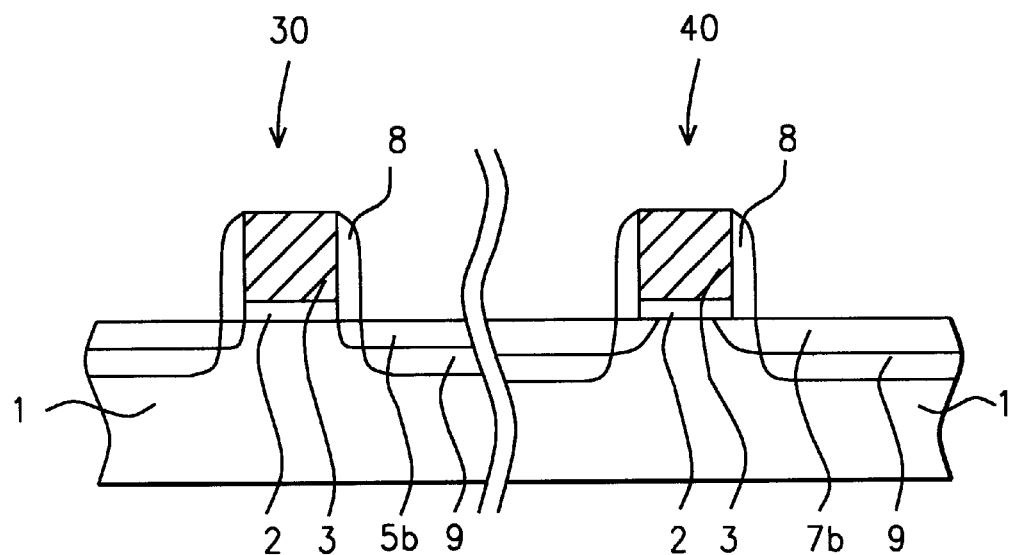

Finally a third ion implantation procedure, is used to create heavily doped source/drain regions 9, in areas of both the core device region 30, and the I/O device region 40, not covered by gate structures or insulator spacers. Heavily doped source/drain regions 9, shown schematically in FIG. 6, are formed via ion implantation of arsenic or phosphorous ions, at an energy between about 1 to 40 KeV, at a dose between about 1E15 to 6E15 atoms/cm$^2$. A second RTA procedure is next preformed in a nitrogen ambient, at a temperature between about 950 to 1050° C., for a time between about 1 to 30 sec., to activate the dopants in the heavily doped source/drain regions, resulting in the desired result of core devices, featuring sharp, or ungraded LDD regions 5b, needed for performance, and the less sharp, or graded, LDD regions 7b, of the higher voltage, I/O device region 40, needed to reduce reliability risks encountered with sharper dopant profiles.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a core device, and an input/output, (I/O), device, on a semiconductor substrate, comprising the steps of:

forming a first-gate structure, on a gate insulator layer, on a first region of said semiconductor substrate, used for said core device, and forming a second gate structure, on said gate insulator layer, on a second region of said semiconductor substrate, used for said I/O device;

ion implanting a first conductivity imparting dopant, into an area of said first region of said semiconductor substrate, not covered by said first gate structure;

performing a first rapid thermal anneal procedure, to activate said first conductivity imparting dopant, creating a core device, lightly doped source/drain region;

ion implanting a second conductivity imparting dopant, into an area of said second region of said semiconductor substrate, not covered by said second gate structure;

forming insulator spacers, on the sides of said first gate structure, and on the sides of said second gate structure, and with a I/O device, lightly doped source/drain region, formed from said second conductivity imparting dopant, during insulator spacer formation;

ion implanting a third conductivity imparting dopant, into an area of said first region of said semiconductor substrate, not covered by said first gate structure, or by said insulator spacers located on the sides of said first gate structures, and into an area of said second region of said semiconductor substrate, not covered by said second gate structure, or by said insulator spacers located on the sides of said second gate structures; and performing a second RTA procedure, activating said third conductivity imparting dopants, creating a core device, heavily doped source/drain region, in said first region of said semiconductor substrate, and creating a I/O device, heavily doped source/drain region, in said second region of said semiconductor substrate.

2. The method of claim 1, wherein said gate insulator layer is a silicon dioxide layer, thermally grown, in an oxygen-steam ambient, to a thickness between about 10 to 90 Angstroms, at a temperature between about 700 to 1000° C.

3. The method of claim 1, wherein said first gate structure, and said second gate structure, are polysilicon gate structures, formed via deposition of a polysilicon layer, using LPCVD procedures, at a thickness between about 1000 to 3000 Angstroms, doped in situ during deposition, via the addition of arsine, or phosphine, to a silane ambient, and patterned via an anisotropic RIE procedure, using $Cl_2$ as an etchant.

4. The method of claim 1, wherein said first gate structure, and second gate structure are polycide gate structures, formed via deposition of an underlying, polysilicon layer, using LPCVD procedures, at a thickness between about 1000 to 2000 Angstroms, and via deposition of an overlying tungsten silicide layer, using LPCVD procedures, at a thickness between about 1000 to 2000 Angstroms, then patterned via an anisotropic RIE procedure, using $Cl_2$ as an etchant.

5. The method of claim 1, wherein said first conductivity imparting dopant is arsenic, or phosphorous, ion implanted at an energy between about 0.5 to 10 KeV, and at a dose between about 1E14 to 1E15 atoms/$cm_2$.

6. The method of claim 1, wherein said first RTA procedure, used to activate said first conductivity imparting dopant, is performed at a temperature between about 900 to 1050° C., for a time between about 1 to 30 sec., in a nitrogen ambient.

7. The method of claim 1, wherein said second conductivity imparting dopant is arsenic, or phosphorous, ion implanted at an energy between about 5 to 50 KeV, at a dose between about 1E13 to 1E14 atoms/$cm^2$.

8. The method of claim 1, wherein said insulator spacers are formed from a silicon oxide layer, obtained via LPCVD procedures, at a temperature between about 650 to 850° C., to a thickness between about 200 to 2000 Angstroms, followed by an anisotropic RIE procedure, using $CHF_3$ as an etchant.

9. The method of claim 1, wherein said third conductivity imparting dopant is arsenic or phosphorous, ion implanted at an energy between about 1 to 40 KeV, at a dose between about 1E15 to 6E15 atoms/$cm^2$.

10. The method of claim 1, wherein said second RTA procedure, is performed at a temperature between about 950 to 1050° C., for a time between about 1 to 30 sec., in a nitrogen ambient.

11. A method of simultaneously fabricating an I/O device, comprised with an LDD source/drain region, featuring a graded dopant profile, and a core device, comprised with an LDD source/drain region, featuring a sharp dopant profile, comprising the steps of:

forming a first gate structure, on a silicon dioxide gate insulator layer, in a first region of a semiconductor substrate, used for said core device, and forming a second gate structure, on said silicon dioxide gate insulator layer, in a second region of said semiconductor substrate, used for said I/O device;

ion implanting a first conductivity imparting dopant, into an area of the core region, not covered by said first gate structure;

performing a first RTA procedure, to activate said first conductivity imparting dopant, and creating a core device, LDD source/drain region, with said sharp dopant profile;

ion implanting a second conductivity imparting dopant, into an area of the I/O device region, not covered by said second gate structure;

depositing an insulator layer, resulting in diffusion of said second conductivity imparting dopant, creating a I/O device, LDD source/drain region, featuring said graded dopant profile;

performing an anisotropic RIE procedure, to create insulator spacers on the sides of said first gate structure, and on the sides of said second gate structure;

ion implanting a third conductivity dopant, into an area of said core region, not covered by said first gate structure, or by said insulator spacers, and into an area of said I/O device, not covered by said second gate structure, or by said insulator spacers; and performing a second RTA procedure, activating said third conductivity imparting dopants, creating a heavily doped source/drain region, for said core device, and creating a heavily doped source/drain region, for said I/O device region.

12. The method of claim 11, wherein said silicon dioxide gate insulator layer, is formed at a thickness between about 10 to 90 Angstroms, via a thermal oxidation procedure, performed in an oxygen-steam ambient, at a temperature between about 700 to 1000° C.

13. The method of claim 11, wherein said first gate structure, and said second gate structure, are polysilicon gate structures, formed via deposition of a polysilicon layer, using LPCVD procedures, at a thickness between about 1000 to 3000 Angstroms, followed by a patterning procedure, performed via an anisotropic RIE procedure, using $Cl_2$ as an etchant.

14. The method of claim 11, wherein said first gate structure, and said second gate structure, are polycide gate structures, formed via deposition of an underlying polysilicon layer, using LPCVD procedures, at a thickness between about 1000 to 2000 Angstroms, and via deposition of an overlying tungsten silicide layer, using LPCVD procedures, at a thickness between about 1000 to 2000 Angstroms, then patterned via an anisotropic RIE procedure, using $Cl_2$ as an etchant.

15. The method of claim 11, wherein said first conductivity imparting dopant is arsenic or phosphorous, ion implanted at an energy between about 0.5 to 10 KeV, at a dose between about 1E14 to 1E15 atoms/$cm^2$.

16. The method of claim 11, wherein said first RTA procedure, used to activate said first conductivity imparting dopant, and to create said core device, LDD source/drain region, is performed at a temperature between about 900 to 1050° C., for a time between about 1 to 30 sec., in a nitrogen ambient.

17. The method of claim 11, wherein said second conductivity imparting dopant is arsenic or phosphorous, ion implanted at an energy between about 5 to 50 KeV, at a dose between about 1E13 to 1E14 atoms/$cm^2$.

18. The method of claim 11, wherein said insulator layer is a silicon oxide layer, at a thickness between about 200 to 2000 Angstroms, obtained via LPCVD procedures, at a temperature between about 650 to 850° C., resulting in the formation of said I/O device, LDD source/drain region, from said second conductivity imparting dopant.

19. The method of claim 11, wherein said insulator spacers, are formed via an anisotropic RIE procedure, performed on said insulator layer, using either $SF_6$, $CF_4$, $CHF_3$, or $C_2F_6$, as an etchant.

20. The method of claim 11, wherein said third conductivity imparting dopant is arsenic, or phosphorous, ion implanted at an energy between about 1 to 40 KeV, at a dose between about 1E15 to 6E15 atoms/cm$^2$.

21. The method of claim 11, wherein said second RTA procedure, used to activate said third conductivity imparting dopant, creating said heavily doped source/drain region, for said core memory device, and for said I/O device, is performed at a temperature between about 950 to 1050° C., for a time between about 1 to 30 sec., in an nitrogen ambient.

* * * * *